United States Patent
Mukherjee et al.

(10) Patent No.: US 7,208,992 B1
(45) Date of Patent: *Apr. 24, 2007

(54) LOSSY LINEARIZERS FOR ANALOG OPTICAL TRANSMITTERS

(75) Inventors: Somnath Mukherjee, Milpitas, CA (US); Yahsing Yuan, San Jose, CA (US); Mridul K. Pal, Santa Clara, CA (US)

(73) Assignee: C-COR.net Corporation, State College, PA (US)

( * ) Notice: Subject to any disclaimer, the term of this patent is extended or adjusted under 35 U.S.C. 154(b) by 1064 days.

This patent is subject to a terminal disclaimer.

(21) Appl. No.: 10/010,615

(22) Filed: Nov. 8, 2001

(51) Int. Cl.
*H03K 5/08* (2006.01)
(52) U.S. Cl. .................. 327/317; 330/149; 398/194
(58) Field of Classification Search ............... 327/308, 327/317; 330/149; 375/296; 398/192–194
See application file for complete search history.

(56) References Cited

U.S. PATENT DOCUMENTS

| | | | |
|---|---|---|---|
| 5,282,072 A * | 1/1994 | Nazarathy et al. .......... 398/193 |
| 5,963,352 A * | 10/1999 | Atlas et al. .................. 398/193 |
| 2005/0036792 A1* | 2/2005 | Frederiksen et al. ........ 398/193 |

* cited by examiner

*Primary Examiner*—Kenneth B. Wells
(74) *Attorney, Agent, or Firm*—Oblon, Spivak, McClelland, Maier & Neustadt, P.C.

(57) ABSTRACT

System and method for even order and odd order nonlinear distortion of a compensating signal that removes substantially all of the nonlinear distortion in one order or in two orders. Two or more diodes are arranged in at least one of an anti-series configuration and an anti-parallel configuration in which a circuit voltage is equal to a selected odd order and/or to a selected even order in current, plus higher order terms that are often negligible. The diodes may be replaced by other selected nonlinear devices.

17 Claims, 13 Drawing Sheets

LOSSY LINEARIZERS FOR ANALOG OPTICAL TRANSMITTERS

FIELD OF THE INVENTION

This invention relates to reducing distortion in opto-electronics devices, using a broadband linearizer.

BACKGROUND OF THE INVENTION

Many opto-electronics devices, such as direct modulated lasers, electro-absorption modulated lasers, and interferometric optical modulators, suffer from distortion due to nonlinear effects that are present in the device in certain signal intensity ranges. At low or moderate input signal intensities, one or two nonlinear terms, proportional to an even power term (e.g., 2 or 4) or proportional to an odd power term (e.g., 3 or 5), often dominate the nonlinear portion of a response. Ideally, it should be possible to compensate exactly for these lowest order nonlinear distortion terms by removing such terms, preferably as a pre-distortion signal.

Several classes of techniques for compensation for presence of nonlinear signal distortion have been developed. A feed-forward technique is capable of achieving suppression of distortion of around 18 dB, with individual controls for even-(second) and odd-(third) order suppression. A general non-linear transfer function can be synthesized in principle by filters/equalizers and a delay line. However, implementation and adjustment is often complicated.

Use of a parametric feedback method is possible only for devices that allow distortion control with an external dc voltage (e.g., second order control for a Mach-Zehnder interferometer).

An in-line technique is simple to implement, but makes some major compromises. One approach uses independent real and imaginary distorters, which are located in the shunt path of the signal flow and thus disturb signal matching. For this reason, the shunt loading by the distorter must be kept small so that only a small amount of controlled distortion can be generated. As a result, these linearizers work well when the device to be linearized does not have appreciable distortion components. Also, it is difficult to separate the real and imaginary parts of a signal completely, and the controls become inter-dependent. The isolation between real and imaginary distortion components is sometimes attempted by amplifiers (usually MMIC's), which are sources of distortion themselves. All these factors limit the performance. Furthermore, these approaches are part of a class of lossy linearizers with the loss approaching zero, and their power handling capability is severely compromised.

Another approach addresses linearization as a purely real part (in-phase) problem. However, even if the non-linear transfer function (NTF) to be compensated is real, the parasitics of the linearizer elements would limit the performance at higher frequencies. Therefore, unless reactive compensation is used, this type of circuit would not be capable of operating over a wide bandwidth. If an imaginary part of the NTF is to be generated, this reference does not indicate how to achieve this. Therefore, this approach would be limited to systems of limited bandwidth and for linearization of real NTFs. This approach also does not teach how to synthesize a second-order (or, more generally, an even-order) non-linearity by itself or in conjunction with some odd-order non-linearity.

What is needed is an approach that provides broadband linearization and reduces odd order and even order signal distortion. Preferably, the approach should provide compensation for separate even order and odd order nonlinear distortion, for combined even and odd order distortion, and for expansive and compressive distortion. Preferably, the approach should provide one or more controllable parameter values that can be used to match the coefficients associated with anticipated nonlinear distortions.

SUMMARY OF THE INVENTION

These needs are met by the invention, which provides a system and method that removes even order, odd order and combined even and odd order nonlinear signal distortion, by generating distortion compensation components using a passive network. This approach does not require use of time delay lines or of phase matching techniques. In one approach, two or more diodes, arranged in an anti-series configuration, in an anti-parallel configuration, or groups of such diode combinations, are provided to selectively generate odd order and/or even order nonlinear terms in a signal intensity with controllable coefficients. The nonlinear terms thus generated are provided as pre-distortion terms and added to the original signal to cancel the lowest order nonlinear terms that would otherwise appear as part of the processed signal. More generally, one or more nonlinear devices is provided as part of a circuit shunt (e.g., as part of a T-network or a π-network) to generate one or more specified nonlinear terms as pre-distortion terms.

DESCRIPTION OF BEST MODES OF THE INVENTION

Figure 1:
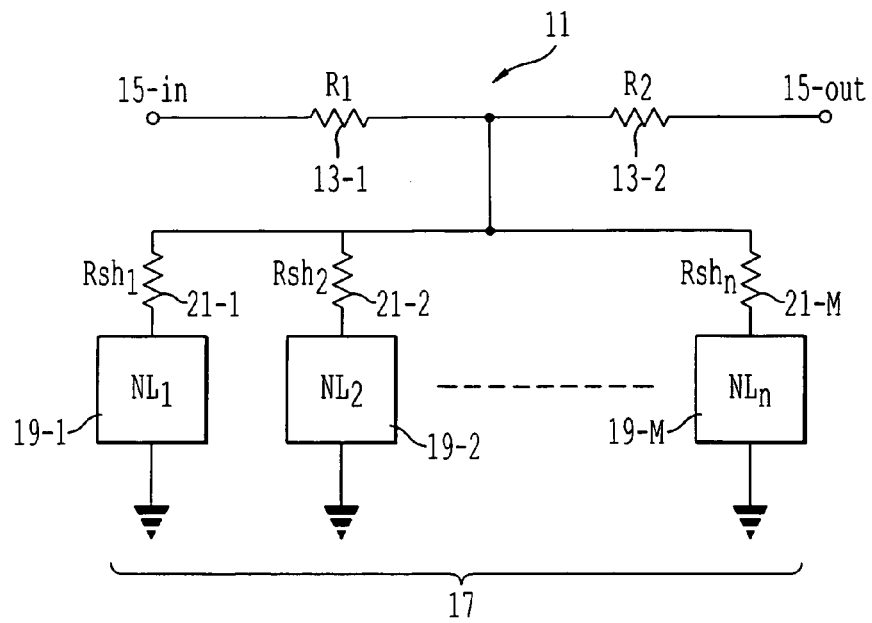
FIG. 1 schematically illustrates a lossy nonlinear network for practising the invention.
Figure 2A:
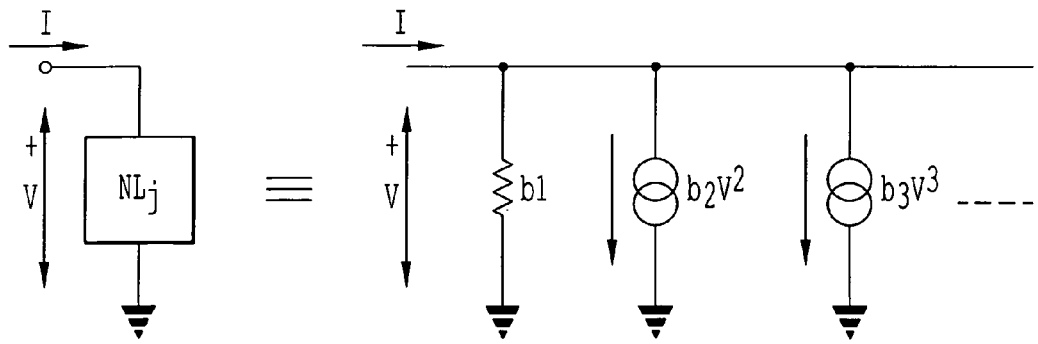
FIGS. 2A and 2B illustrate equivalent one-port circuits that are part of the network in FIG. 1.
Figure 2B:
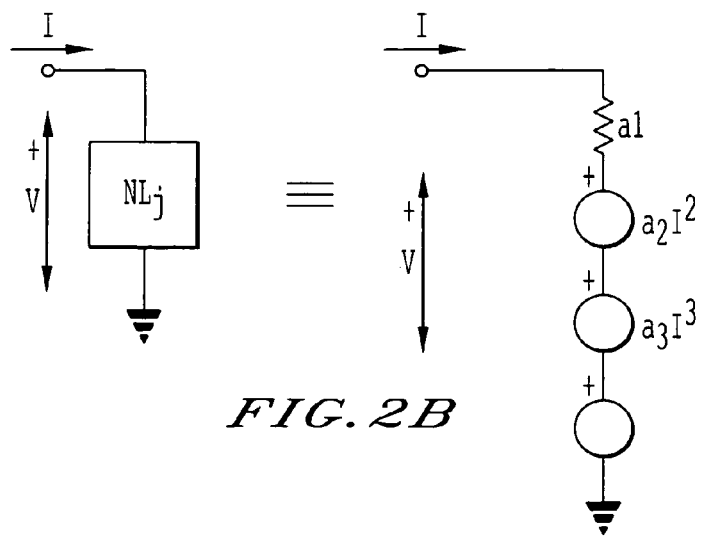

FIG. 1 illustrates a general lossy circuit 11 for practising the invention. The circuit 11 includes first and second primary resistors or impedances 13-1 and 13-2, having selected impedance values, R1 and R2, and being connected in series between an input port 15-in and an output port 15-out. A second terminal of the first impedance 13-1 is connected to a first terminal of the second impedance 13-2 and to a nonlinear shunt circuit 17 having M nonlinear one-port sub-circuits 19-i (i=1, 2, ..., M; M>1). Any two of the nonlinear sub-circuits 19-i may be qualitatively similar or may differ from each other. Each nonlinear sub-circuit 19-i includes one or more entrance impedances 21-i, having a selected impedance value and being connected to a nonlinear sub-device 19-i. The nonlinear sub-device 19-i provides a nonlinear relationship between voltage V at a device input terminal and current I induced in the sub-device. This nonlinear relationship may be expressed as $$I(V) = \Sigma_{k=0} b_k \cdot V^k, \tag{1}$$

where the coefficients $b_k$ may be real or complex, and $b_k \neq 0$ for at least one index k>1. This nonlinear relationship may also be expressed as $$V(I) = \Sigma_{h=0} a_h \cdot I^h, \tag{2}$$

where the coefficients $a_h$ may be real or complex, and $a_h \neq 0$ for at least one index h>1. The coefficients $b_0$ and $a_0$ are ignored here. From Eq. (1), a one-port nonlinearity can be represented as a sum of a linear conductivity term (proportional to $b_1$) and controlled current sources representing higher degree dependences upon the voltage V. This characterization is illustrated in FIG. 2A. The dual of this characterization is illustrated in FIG. 2B, where the one-port nonlinearity is represented as a sum of a linear impedance term (proportional to $a_1$) and controlled voltage sources representing higher degree dependences upon the current I.

Figure 3:
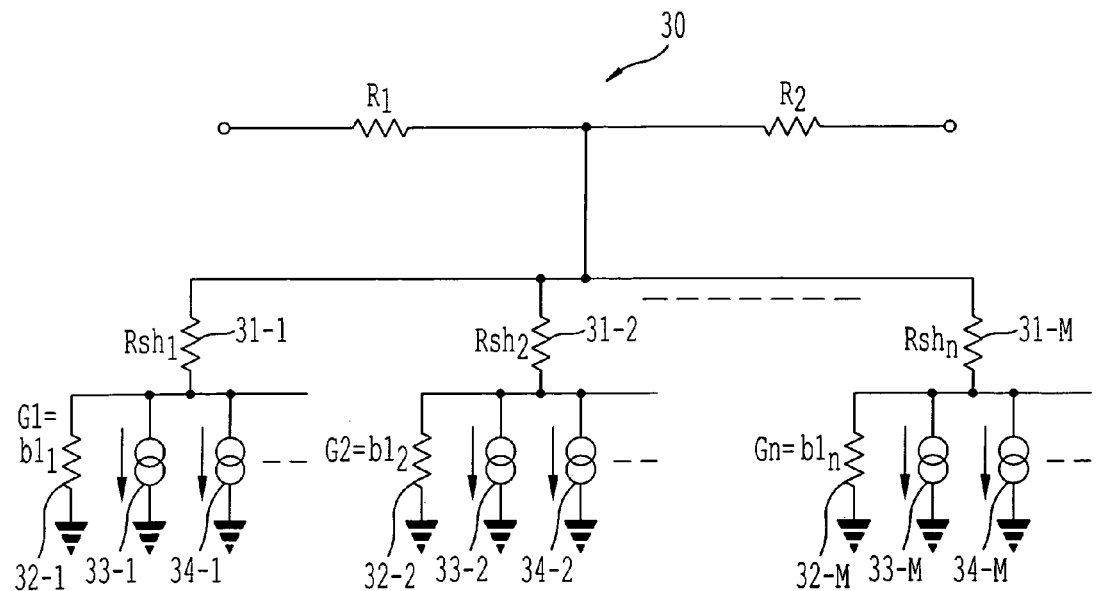
FIGS. 3 and 4 illustrate an equivalent current source network and a linear equivalent, respectively, that can be used to represent the circuit in FIG. 1.

The circuit in FIG. 1 can be reexpressed in a current source representation of a circuit 30, as shown in FIG. 3. If the nonlinear current sources 33-i and 34-i (i=1, 2, ..., M) in FIG. 3 are temporarily ignored, the circuit 30 in FIG. 3 reduces to a linear equivalent configuration 40 shown in FIG. 4, which includes a shunt resistance ($R_{sh}$) 41 in series with a shunt resistance (1/G) 42.

Figure 4:
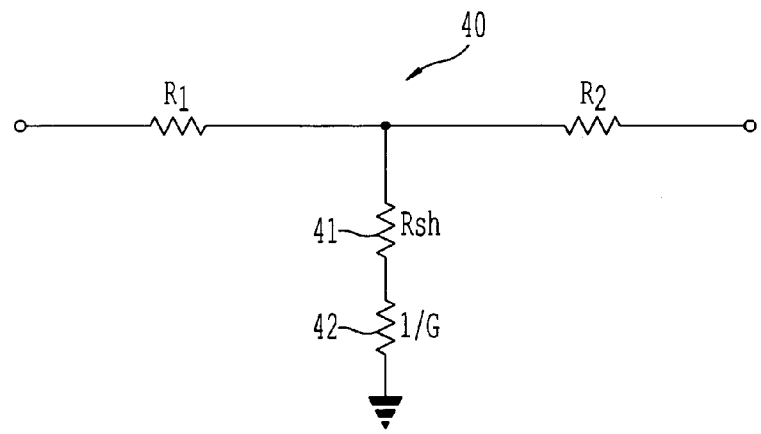

In FIG. 4, the formal sum $$R_{sh} + 1/G$$

is equivalent to a parallel combination of circuit elements, $$R_{sh,m} + 1/G_m (m=1, 2, ..., M),$$

shown in FIG. 3. The circuit shown in FIG. 4 can be configured as a symmetric attenuator with a specified loss and characteristic impedance.

A fundamental principle of weakly nonlinear networks allows one to calculate the results of an excitation (I or V) of the one-port circuit shown in FIG. 1, using a linear equivalent network. The nonlinear current (or voltage) sources in FIG. 3 can be subsequently computed. These derived sources, together with the fundamental (linear) sources, are treated as part of a linear network.

Figure 5A:
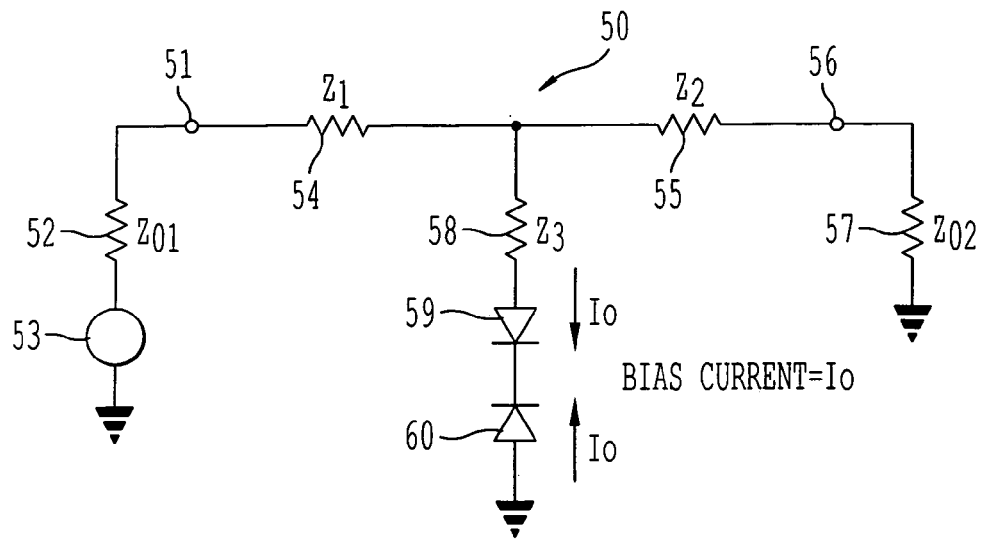
FIGS. 5A, 5C and 5D illustrate diode circuits for generating odd order expansive nonlinear distortion signal compensation.

FIG. 5A illustrates a diode-based circuit 50, not including a biasing circuit, for generating expansive, odd order (mainly third order) inter-modulation products. The circuit may be asymmetric or symmetric, with image impedances $Z_{01}$ and $Z_{02}$. In FIG. 5A, an input terminal 51 is connected across a selected impedance 52 to a voltage source 53, which has one terminal grounded. The input terminal 51 is connected across two selected impedance, 54 and 55, in series to an output terminal 56, which is grounded across a selected impedance 57.

A pair of opposed and matched diodes, 59 and 60, is arranged in series (an "anti-series" configuration), where the cathodes are connected together. An anti-series configuration of two diodes also includes a second arrangement where two opposed and matched diodes are arranged in series and joined anode to anode, corresponding to exchange of the diodes 59 and 60 in FIG. 5A. In FIG. 5A, a second terminal (anode in FIG. 5A) of the diode 59 is connected across a selected impedance 58 to a common terminal CT of the impedances 54 and 55, and a second terminal (anode in FIG. 5A) of the diode 60 is grounded. The anti-series configuration of the two diodes, 59 and 60, is provided with a bias current $I_0$, as indicated. The voltage V(I) as a function of current can be approximated as $$V(I) = a_1 \cdot I + a_3 \cdot I^3 + a_5 \cdot I^5 + \ldots, \tag{3}$$

where the first few coefficients in Eq. (3) are $$a_1 = 2 \cdot V_t / I_0, \tag{4a}$$

$$a_3 = 2 \cdot V_t / (3 \cdot I_0^3), \tag{4b}$$

The third order term has a positive sign, corresponding to an expansive compensation mode, and the value of $a_3$, for example, can be adjusted by adjusting the value of bias current $I_0$.

The circuit in FIG. 5A is a particular implementation of the general circuit shown in FIG. 1, wherein the nonlinear sub-device 19-1 is a matched diode pair in an anti-series configuration and the nonlinear sub-devices 19-i (i=2, ..., M) are absent.

Figure 5B:
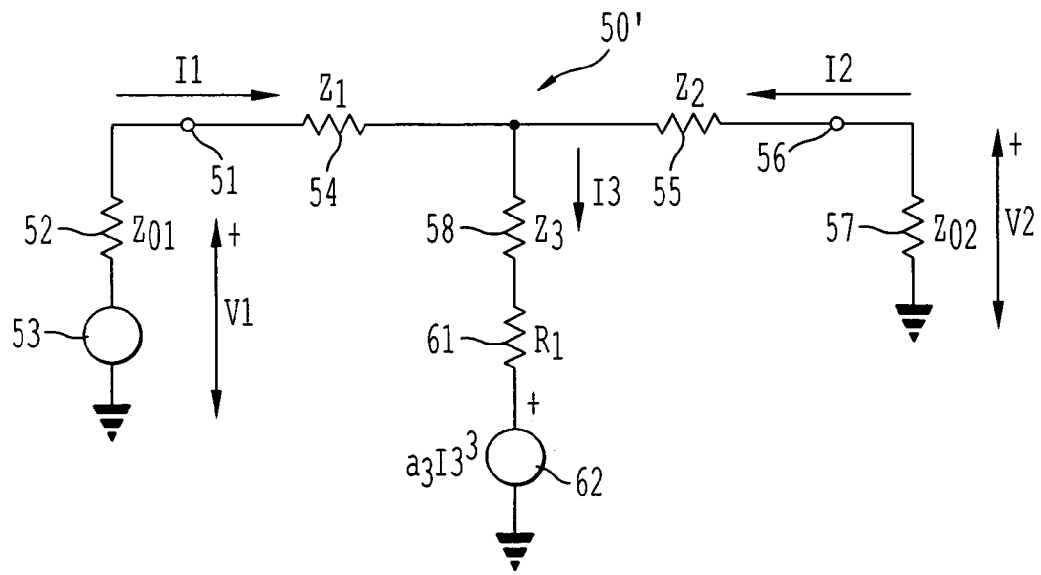
FIG. 5B illustrates an equivalent circuit for the circuit of FIG. 5A.

Ignoring terms involving $I^5$ and higher degree in the current, the current-voltage relationship for an opposed diode pair is represented an equivalent arrangement shown in FIG. 5B, where the anti-series arrangement of the diode pair, 59 and 60, is replaced by a series combination of a resistance 61 (linear in I) and a current term 62 with an associated voltage proportional to $a_3 \cdot I^3$. One can verify that, as the parameter value $I_0$ increases, the relative amount of nonlinear distortion decreases.

Figure 5C:
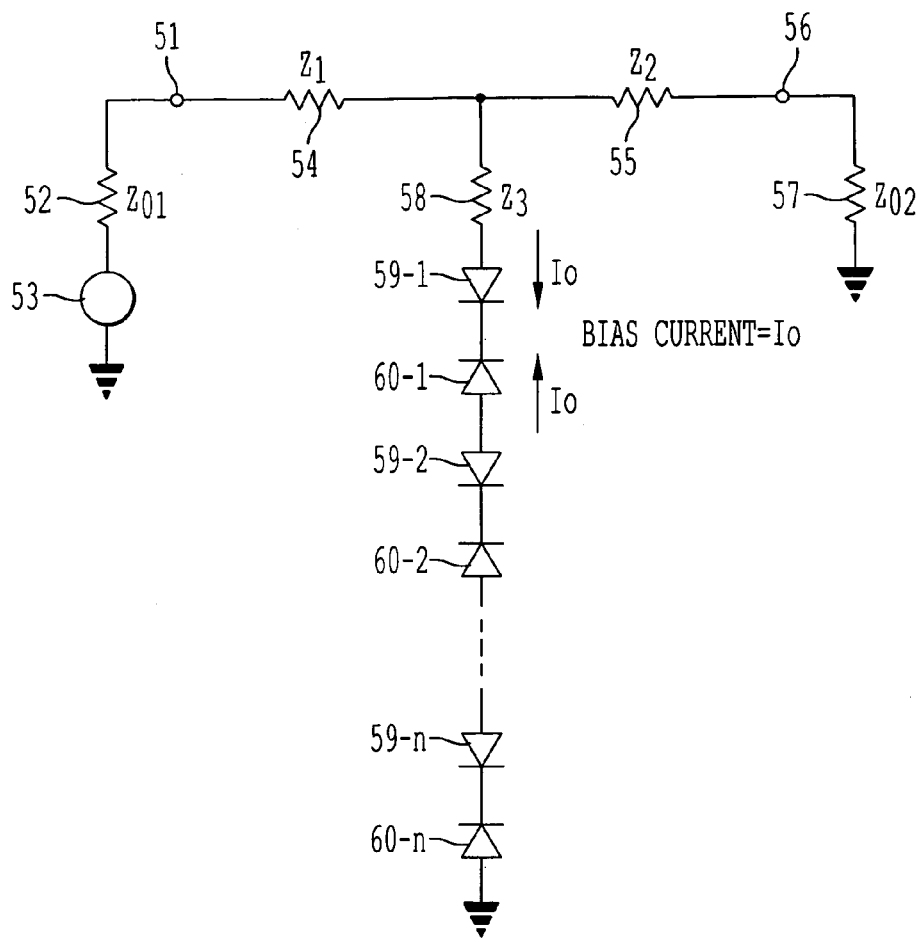

The ratio of two-tone intermodulation component to fundamental signal component is given in dB by $$IM_3 = 20 \cdot \log_{10}\{1.5F \cdot a_3 \cdot Z_0 \cdot P_{out}\}, \tag{5}$$

where $P_{out}$ is output power (Watts) and the factor F for a symmetric network ($Z_1 = Z_2$, $Z_{01} = Z_{02} = Z_0$) is $$F = 0.5 \cdot Z_0 \cdot (1 + Z_1/Z_0)^3 / \{(Z_3 + R_1)^3 \cdot [R_1 + Z_3 + (Z_1 + Z_0)/2]\}. \tag{6}$$

Where n matched and opposed diode pairs are arranged in series (n=1, 2, ...), as in FIG. 5C, it is shown in the Appendix that the current-voltage relationship is as in Eq. (3) with the following changes in coefficient values:

$$a_1 = 2 \cdot n \cdot V_t / (\cdot I_0), \tag{7a}$$

$$a_3 = 2 \cdot n \cdot V_t / (3 \cdot I_0^3), \tag{7b}$$

The shunting effect of the nonlinear terms are reduced relative to the linear term shunting effect as the integer n increases.

Figure 5D:
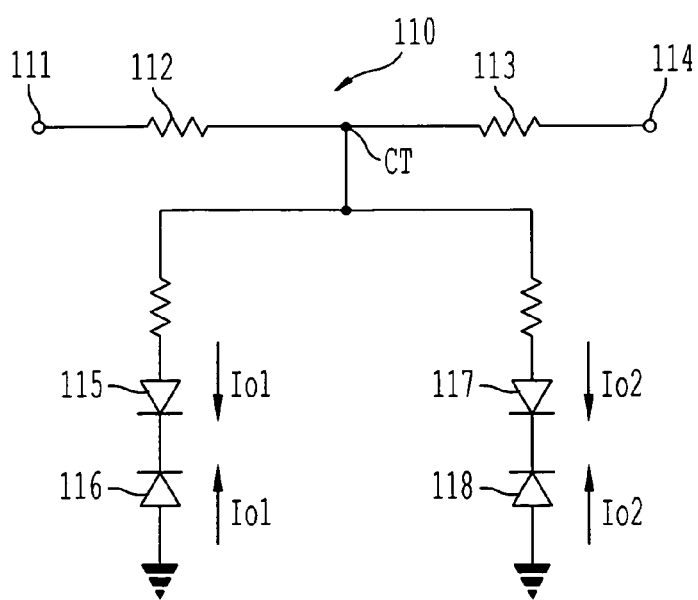
Figure 14:
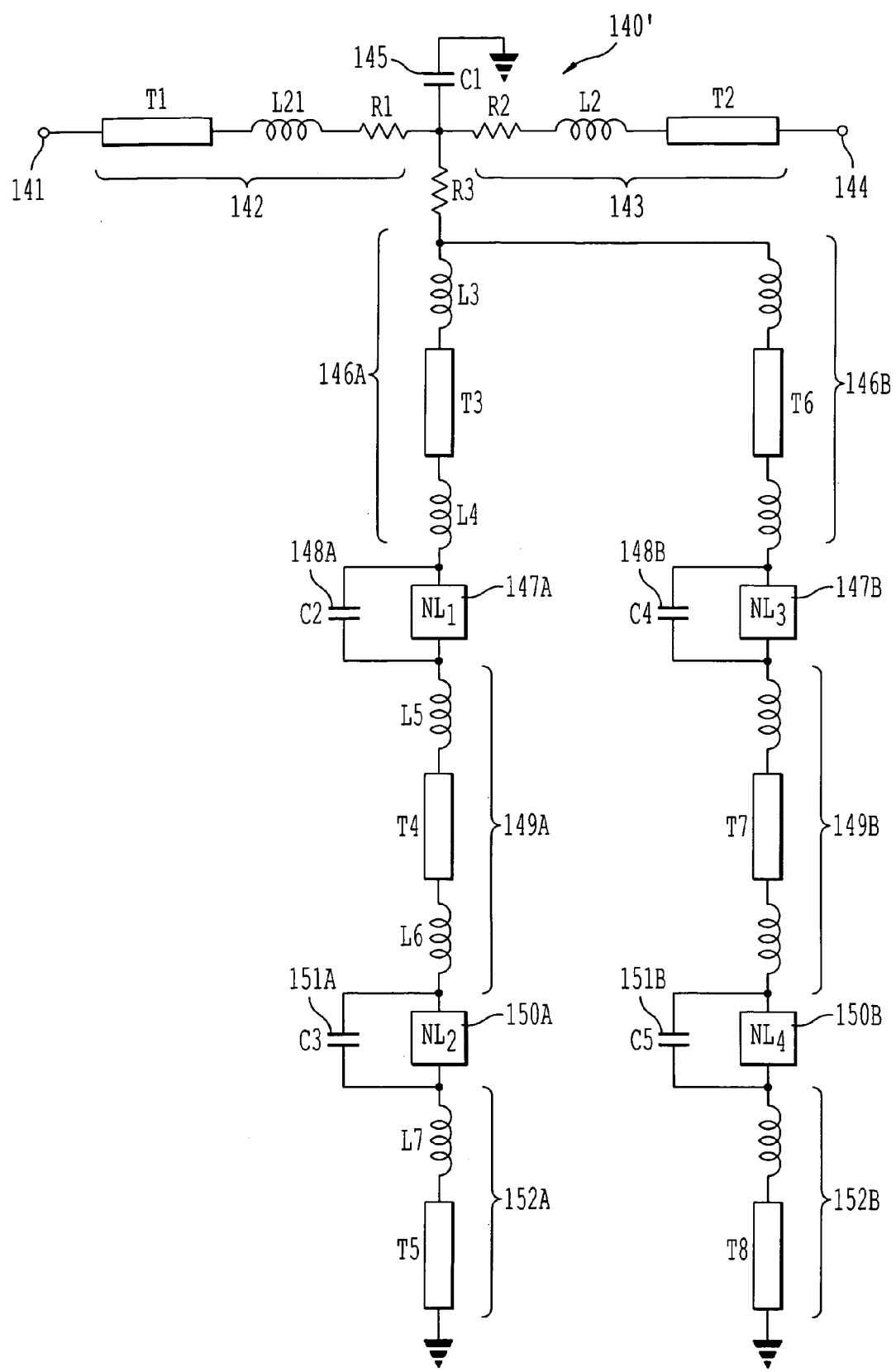

FIG. 5D illustrates a circuit 110 that generates expansive odd order nonlinear components and that handles higher power values than can the circuit shown in FIG. 5A. The circuit 110 provides a first pair of diodes, 115 and 116, in an anti-series configuration and a second pair of diodes, 117 and 118, in an anti-series configuration, in separate shunt arms. An advantage of this circuit, compared to the circuit shown in FIG. 5A, is that the parasitics are reduced, as indicated in FIG. 14, discussed in the following.

The circuit in FIG. 5D is a particular implementation of the general circuit shown in FIG. 1, wherein the nonlinear device 19-1 is a matched diode pair in an anti-series configuration, the nonlinear sub-device 19-2 is a matched diode pair in an anti-series configuration, and the nonlinear sub-devices 19-i (i=3, ..., M) are absent.

Figure 6:
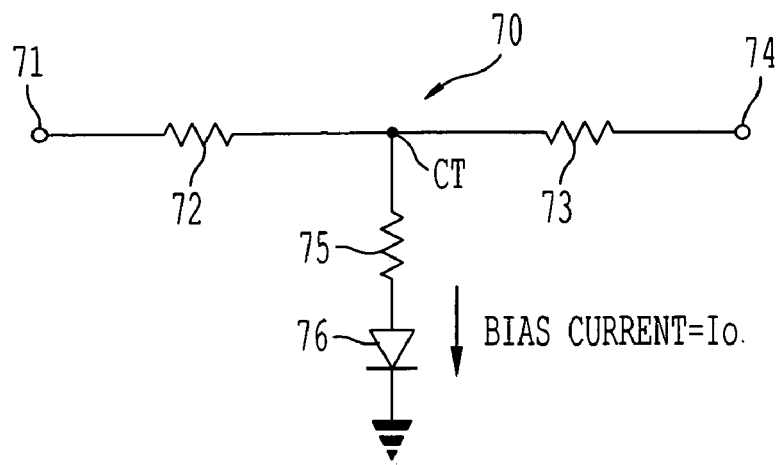
FIG. 6 illustrates a diode circuit for generating simultaneous even and expansive odd order nonlinear distortion signal compensation.

FIG. 6 illustrates a circuit 70 that generates both even order and odd order nonlinear components. The circuit 70 includes first and second selected impedances, 72 and 73, connected in series between an input terminal 71 and an output terminal 74. A diode 76 has one terminal grounded and has the other terminal connected across a third selected impedance 75 to a common terminal of the first and second impedances, 72 and 73.

The current-voltage relationship of Eq. (2) is applicable, and the first few coefficients $a_k$ for the diode 76 are shown in an Appendix to be $$a_1 V_t / I_0, \tag{8a}$$

$$a_2 = -V_t / (2 \cdot I_0^2), \tag{8b}$$

$$a_3 = V_t / (3 \cdot I_0^3). \tag{8c}$$

Odd order components can be expansive or compressive, corresponding to a phase of 0 or π, respectively, in the Nonlinear Transfer Function (NTF). The phase of the even order nonlinear components can also be controlled by selecting the polarity of the diode.

The circuit in FIG. 6 is a particular implementation of the general circuit shown in FIG. 1, wherein the nonlinear sub-device 19-1 is a single diode and the nonlinear sub-devices 19-i (i=2, ..., M) are absent.

Figure 7A:
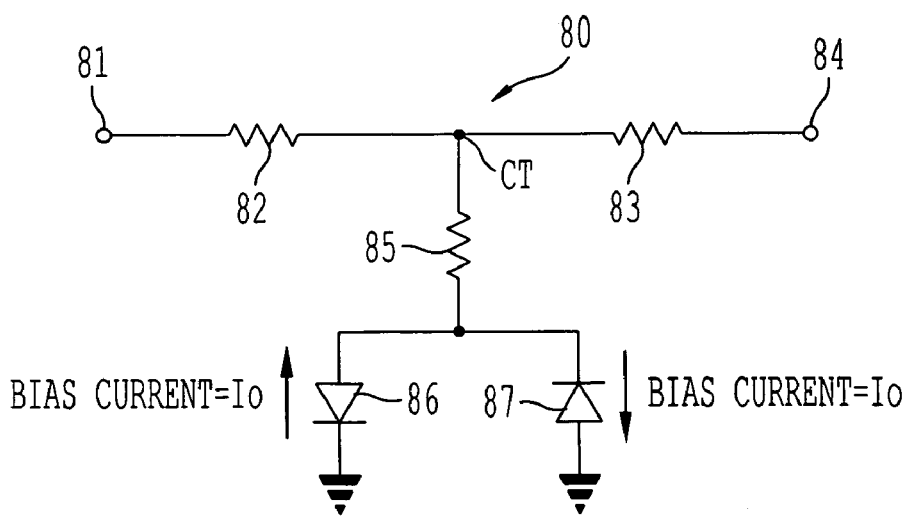
FIGS. 7A and 7B illustrate diode circuits for generating odd order compressive nonlinear distortion signal compensation.

FIG. 7A illustrates a circuit 80 that generates odd order nonlinear components in a compressive mode. The circuit 80 includes first and second selected impedances, 82 and 83, connected in series between an input terminal 81 and an output terminal 84. Two matched and opposed diodes, 86 and 87, are arranged in parallel (an "anti-parallel" configuration), with the anode of one diode 86 connected to the cathode of the other diode 87. In FIG. 7A, the cathode of the diode 86 and the anode of the diode 87 are grounded. The anode of the diode 86 and the cathode of the diode 87 are connected to a third selected impedance 85, which is connected to a common terminal CT of the first and second impedances, 82 and 83. The current-voltage relationship for the circuit in FIG. 7 becomes $$V(I) = a_1 \cdot I + a_3 \cdot I^3 + a_5 \cdot I^5 + \ldots, \tag{9}$$

where $a_1$ is positive and $a_3$ and $a_5$ can be shown to have negative signs, corresponding to a compressive mode.

The circuit in FIG. 7A is a particular implementation of the general circuit shown in FIG. 1, wherein the nonlinear sub-device 19-1 is a diode pair in an anti-parallel configuration and the nonlinear sub-devices 19-i (i=2, ..., M) are absent.

Figure 7B:
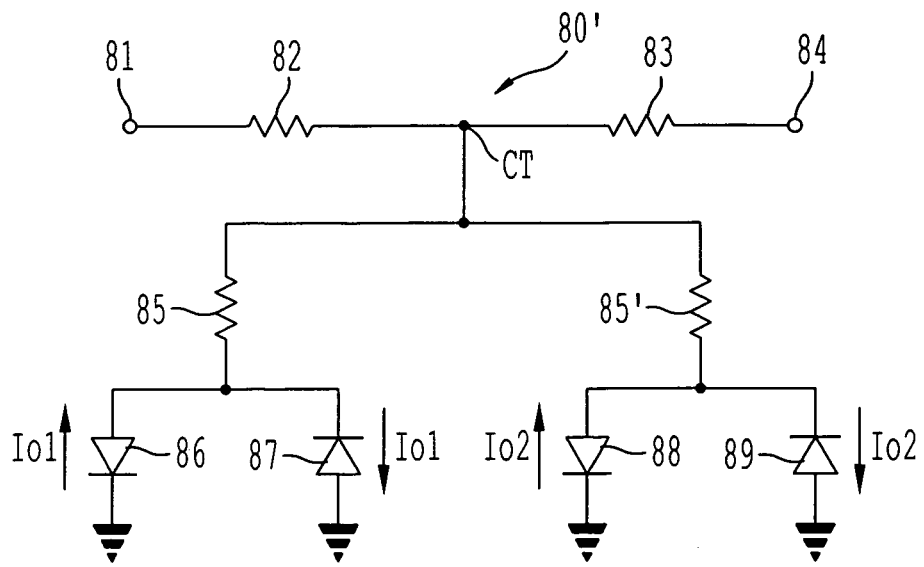

FIG. 7B illustrates a modification of the circuit shown in FIG. 7A, in which first and second anti-parallel diode pairs, (86,87) and (88,89), are located in first and second shunt arms. A common terminal of the first diode pair (86,87) is connected across a third impedance 85 to the common terminal CT of the first and second impedances, 82 and 83; and a common terminal of the second diode pair (88,89) is connected across a fourth impedance 85' to the common terminal CT of the first and second impedances, 82 and 83. The other terminals of each diode pair are grounded.

Figure 8:
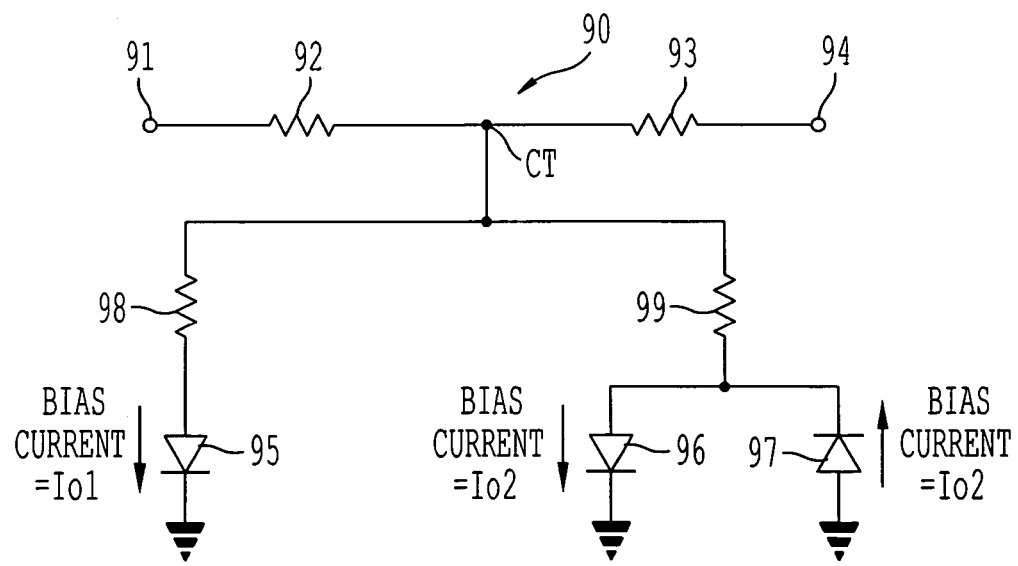
FIG. 8 illustrates a diode circuit for generating even order nonlinear distortion signal compensation.

FIG. 8 illustrates a circuit 90 that generates even order nonlinear components, in which the expansive odd order nonlinear components from a single diode 95 in a first shunt arm cancel the odd order nonlinear components from an anti-parallel configuration of two diodes, 96 and 97, in a second shunt arm. The current-voltage relationship for the circuit 90 becomes $$V(I) = a_1 \cdot I + a_2 \cdot I^2 + a_4 \cdot I^4 + \ldots, \tag{10}$$

$$a_1 = V_t / I_0, \tag{11a}$$

$$a_2 = -V_t / 2I_0^2, \tag{11b}$$

The circuit in FIG. 8 is a particular implementation of the general circuit shown in FIG. 1, wherein the nonlinear device 19-1 is a single diode, the nonlinear sub-device 19-2 is a matched diode pair in an anti-parallel configuration, and the nonlinear sub-devices 19-i (i=3, ..., M) are absent.

Figure 9:
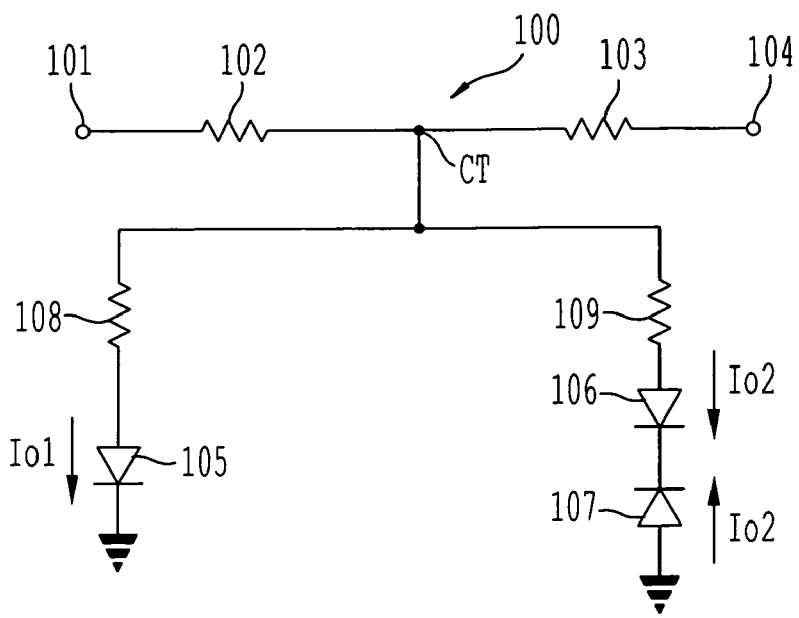
FIG. 9 illustrates a diode circuit for simultaneously generating even order and odd order nonlinear distortion signal compensation.

FIG. 9 illustrates a circuit 100 that generates even and odd order nonlinear components, using a single diode 105 in a first shunt arm and two diodes, 106 and 107, in an anti-series configuration in a second shunt arm. The odd order and even order components can be controlled by independently adjusting the bias currents, $I_{01}$ and $I_{02}$.

The circuit in FIG. 9 is a particular implementation of the general circuit shown in FIG. 1, wherein the nonlinear device 19-1 is a single diode, the nonlinear sub-device 19-2 is a matched diode pair in an anti-series configuration, and the nonlinear sub-devices 19-i (i=3, ..., M) are absent.

A selected pre-distortion circuit (e.g., the circuit in FIG. 5A or 8) is provided with appropriate diode bias current values $I_0$ so that, when the pre-distortion nonlinear terms generated by that circuit are added to a nominally linear current input signal I and processed, the output signal has a linear term (proportional to I) and has no nonlinear terms of order or degree 2 and/or 3.

As an example of application of the invention, a third order compressive nonlinearity is pre-distorted, using the third order expansive circuit of FIG. 5A. Parameters of interest here include: (1) third order output intercept point $IP_3$; (2) loss in the (equivalent linear) circuit; (3) bias current through the diode(s); (4) number (n) of diode pairs used (preferably minimized to reduce the diode parasitics); and (5) desired output power.

The third order intercept point can be expressed in dBm as $$IP_3 = 10 \cdot \log\{I_0^3 / (F \cdot n \cdot V_t \cdot Z_0)\} + 30. \tag{12}$$

An important constraint for operation of these types of circuits is that the diodes should not undergo any clipping, wherein a diode output signal is artificially limited or manifests a plateau at a peak value. To avoid clipping, the peak rf current in the shunt arm of a circuit cannot exceed the bias current through the nonlinear elements. This requirement sets a limit on available rf power at an output terminal of the circuit. This limit can be expressed as a lower bound on the third order intercept point of the circuit.

$$IP_3 > 10 \cdot \log\{N_3/D_3\} + 30, \quad (13)$$

$$N_3 = 2[P_{out}^3 \cdot Z_0]^{1/2}(N + 2 \cdot N^{1/2} - 1) \cdot \zeta^3, \quad (14)$$

$$D_3 = (N-1) \cdot n \cdot V_t, \quad (15)$$

where $\zeta$ is a form factor (peak current/rms current) for the exciting signal and N is loss of the linear equivalent circuit, expressed in nepers. If the excitation signal is a multi-tone signal similar to a Gaussian distribution, $\zeta$ can be approximated as a constant.

Figure 10:
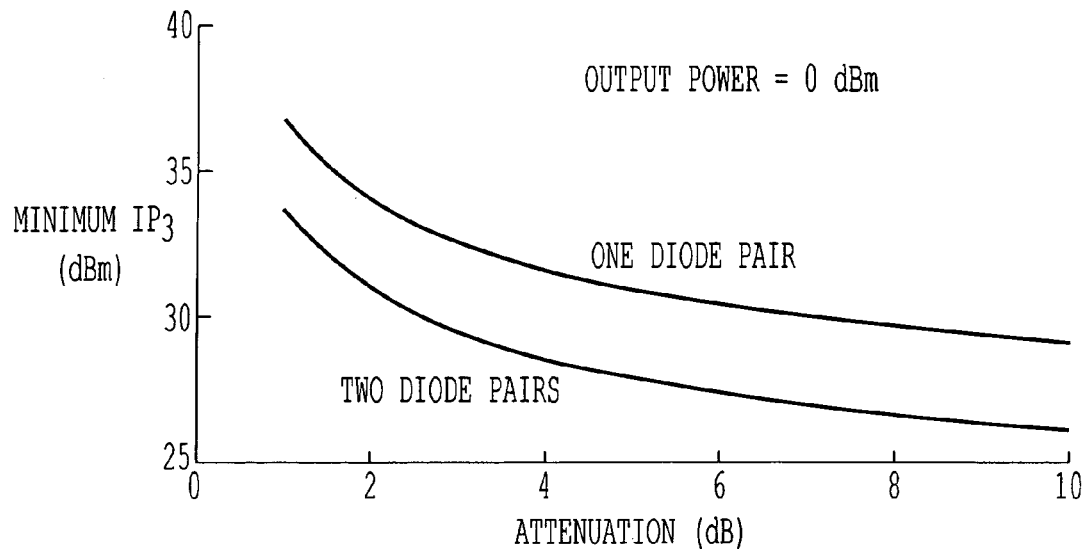
FIG. 10 is a graphical view of variation of minimum third order intercept $IP_3$ attainable as a function of attenuation for the circuit of FIG. 5A, for one and two diode pairs.

FIG. 10 graphically illustrates the minimum attainable third order intercept point $IP_3$ for the circuit of FIG. 5C as a function of loss N, for n=1 and n=2 pairs of diodes. The output power requirement for the linearizer is assumed to be 0 dBm. If, for example, an $IP_3$ value of about +27 dBm is needed and the system cannot tolerate a loss greater than 7 dB, FIG. 10 indicates that a single diode pair (n=1) cannot be used to achieve these goals. If the circuit in FIG. 5C uses n—2 diode pairs (or more), the desired system can be realized. As the minimum value of $IP_3$ is further reduced, for a given attenuation value, additional diode pairs (n>2) may have to be introduced, if the circuit of FIG. 5C is used. After the loss and number n of diode pairs are determined, bias current values $I_0$ are adjusted to provide a pre-distortion signal that cancels one or more nonlinear components in a distorted signal. These principles can be extended from the circuit in FIG. 5C to any of the circuits shown in FIGS. 6, 7, 8, 9 and 10, depending upon the character of the pre-distortion signal needed.

Figure 11:
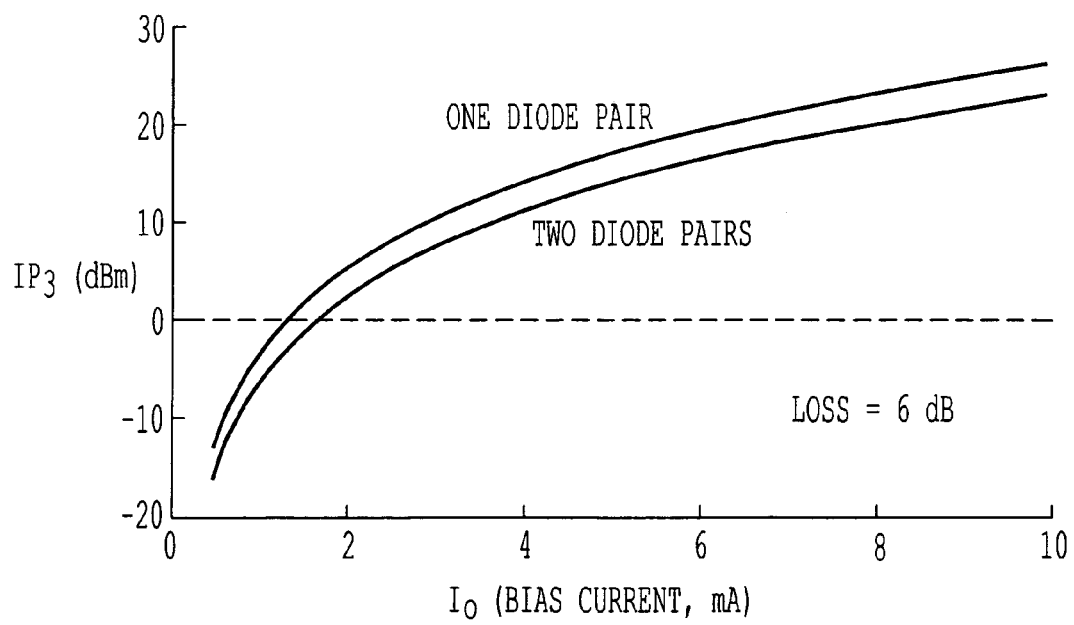
FIG. 11 is a graphical view of variation of IP3 as a function of bias current for the circuits of FIGS. 5A and 5C, for one and two diode pairs.

The graph in FIG. 10 is used for design purposes, to determine the (minimum) number n of diode pairs needed for given ranges of $IP_3$ and of attenuation. The graph in FIG. 11 uses Eq. (12) to calculate $IP_3$ as a function of bias current $I_0$ for n=1 and n=2 diode pairs in the anti-series diode configuration of FIG. 5C. Here, a prescribed loss of 6 dB is assumed in order to determine attainable circuit performance, for example, $IP_3$ as a function of $I_0$. As an example, choice of a bias current value $I_0$=4 mA, sets the $IP_3$ value at about 14 dBm and 11 dBm for n=1 and n=2 diode pairs, respectively. This example of the anti-series diode configuration of FIG. 5C (with n diode pairs) can be carried out by analogy for any of the circuits shown in FIGS. 6, 7, 8 and 9, as well as for other diode-based circuits.

Figure 12:
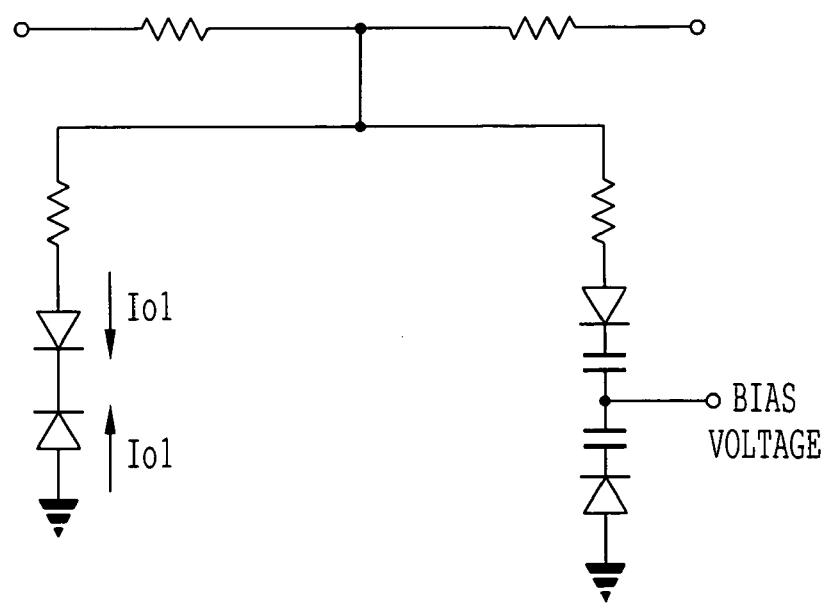
FIG. 12 illustrates a circuit for generation of in-phase and quadrature signal components according to the invention.

These examples use single diodes and diode pairs to generate the desired nonlinear components. Schottky-barrier diodes are a suitable choice. However, MESFETs and varactors can also be used here. FIG. 12 shows a circuit that generates an in-phase component and a quadrature component from Schottky barrier diodes and from varactor diodes, respectively. This configuration may serve as a first step in synthesis of a generalized NTF. The varactor diode arm generates a mixture of in-phase and quadrature components, whereas the Schottky diode arm ideally generates only an in-phase component (resistive action only). The mix of in-phase and quadrature components can be controlled by choice of the resistive arm current. The in-phase component generated by the varactor diode arm is accentuated by the resistive arm. If the anti-series diode configurations in FIG. 12 are replaced by anti-parallel diode configurations, the strength of the in-phase component(s) can be reduced.

These examples use T-networks to synthesize the desired nonlinear circuits. A Π-network can also be used here to generate similar nonlinear components, with the choice of T-network or Π-network often being dictated by design requirements at high frequencies.

Figure 13:
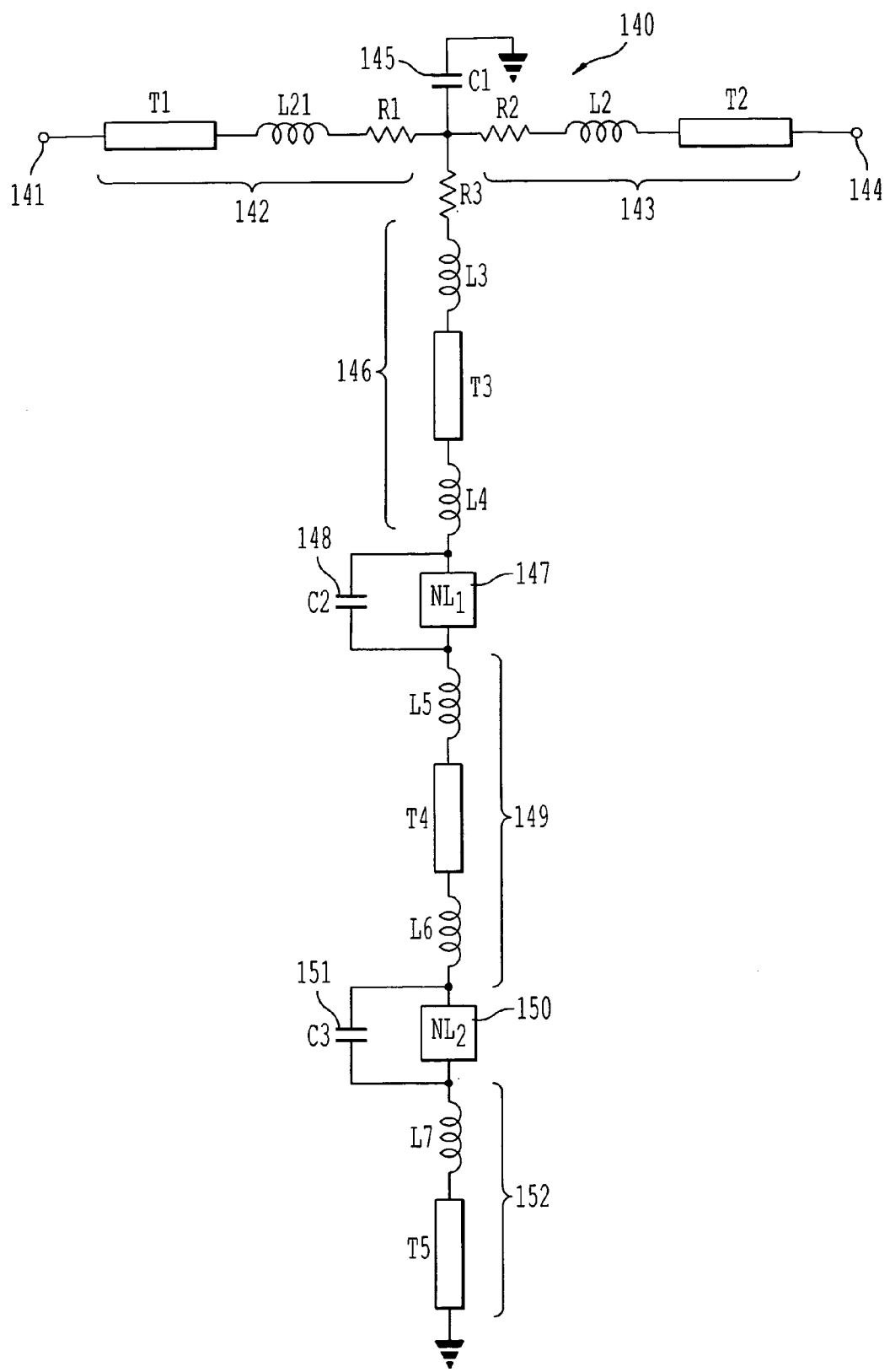
FIGS. 13 and 14 explicitly illustrate presence of certain parasitics in circuits such as that shown in FIGS. 1 and 5A.

An equivalent for the circuit in FIG. 5A, but explicitly incorporating parasitics, is shown in a circuit 140 in FIG. 13. In FIG. 13: a common terminal CT of the first and second impedances, 54 and 55, of FIG. 5A is grounded through a first capacitance 145 to represent a parasitic capacitance to ground; a first nonlinear sub-device (e.g., a diode or diode pair) 147 is connected in parallel with a first shunt capacitance 148; and a second nonlinear sub-device 150 is connected in parallel with a second shunt capacitance 151. The impedances 142, 143, 146, 149 and 152 include ideal lumped resistors and transmission line segments (Tj; j=1, . . . , 5) with parasitic inductances. The nonlinear sub-devices, 147 and 150, are ideal, memoryless nonlinear systems, which are reasonable models for forward-biased, clipping-free, Schottky barrier diodes, for reasonable frequencies of operation.

The values of the first and second shunt capacitances, 148 and 151, are small and produce large corresponding reactances compared to the instantaneous forward resistance of each diode. For reasonable frequencies of operation (e.g., 50–860 MHz), a forward biased Schottky diode is closely approximated by a memoryless nonlinear sub-device in series with inductors and transmission lines.

The circuit 140' in FIG. 14 is analogous to FIG. 13 and explicitly incorporates parasitics for the circuit shown in FIG. 5D. The interpretations of the circuit components 146B, 147B, 148B, 149B, 150B, 151B and 152B in FIG. 14 are analogous to the interpretations of the circuit components 146, 147, 148, 149, 150, 151 and 152 in FIG. 13.

Figure 15:
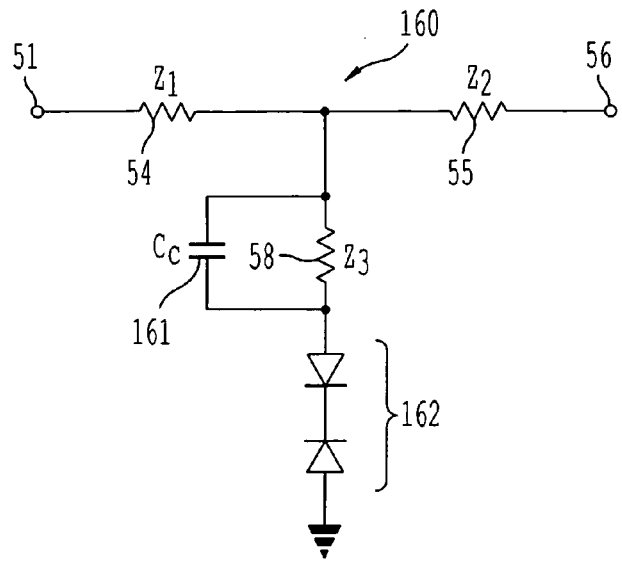
FIGS. 15 and 16 illustrate addition of compensating capacitors in parallel with selected impedances in FIGS. 1 and 5A.

The nonlinear transfer function (NTF) for the circuit shown in FIGS. 13 and 14 are, of course, not ideal, due to the presence of various reactive elements. Addition of a compensating capacitor (161 in FIG. 15) in parallel with the third impedance 58 in FIG. 5A, as illustrated in the circuit 160 in FIG. 15, can provide an approximation to an ideal (non-reactance) NTF within a selected frequency band. For example, for CATV applications in the 50–860 MHz range, a capacitance value for the compensating capacitor 161 can be found that maintains the magnitude of the circuit NTF within +/−0.25 dB and NTF phase within +/−5°. The compensating capacitor 161 provides a bypass path for high frequency components of the current flowing through the third impedance 58, and these high frequency components arrive at the nonlinear sub-device 162 in FIG. 15 (e.g., a matched diode pair in an anti-series configuration) faster than would occur in the absence of the capacitor 161. This accelerated arrival of the high frequency components tends to compensate for the finite time delay introduced by the transmission lines in the impedances 146, 149 and 152, as shown in FIG. 14.

Figure 16:
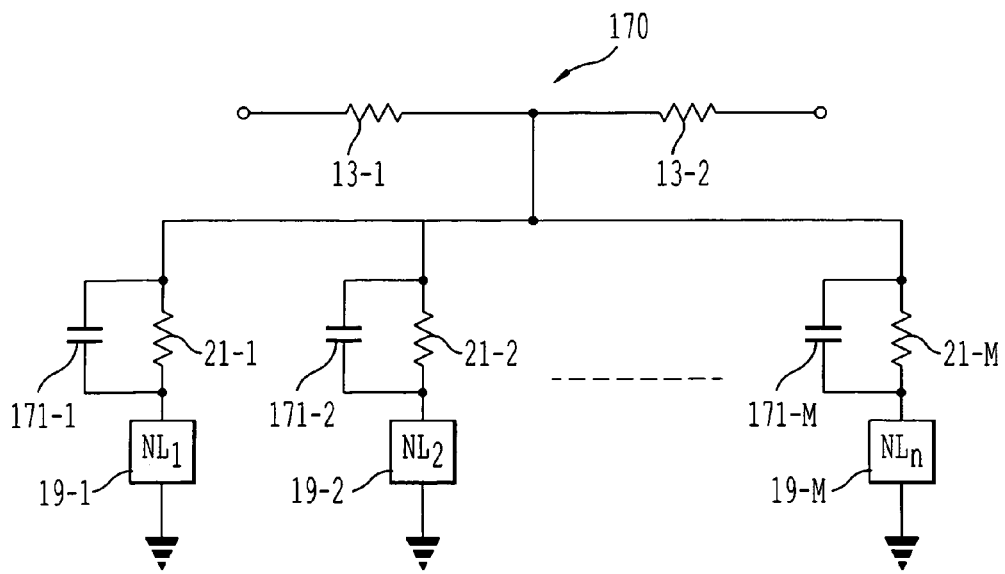

FIG. 16 illustrates addition of a compensating capacitor 171-i in parallel with an associated resistor 21-i (i=1, 2, . . . , M) in a circuit 170 that corresponds to the circuit 11 in FIG. 1. Addition of these compensating capacitors 171-i in the circuit 170 will also partly compensate for the presence of reactive parasitics in the circuit 11 shown in FIG. 1.

Figure 17:
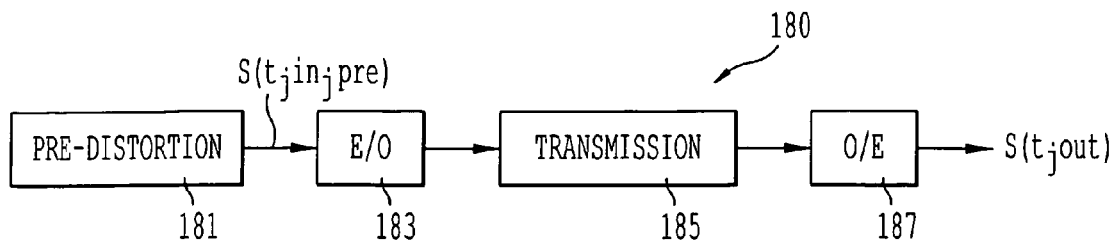
FIG. 17 schematically illustrates generation and application of a pre-distortion signal for compensation.
Figure 18:
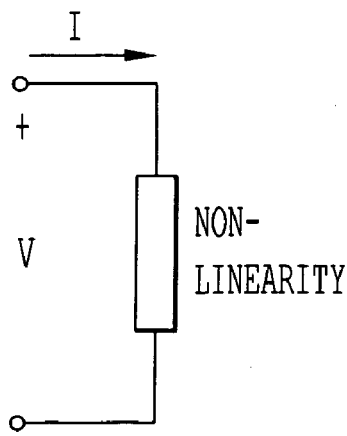
FIGS. 18–23 illustrate nonlinear circuits discussed in Appendices A and B.
Figure 19:
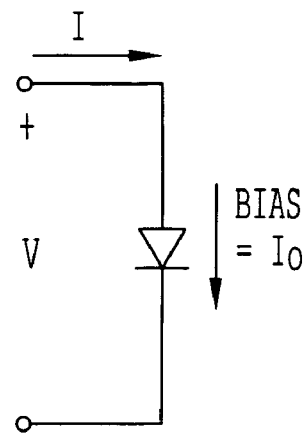
Figure 20:
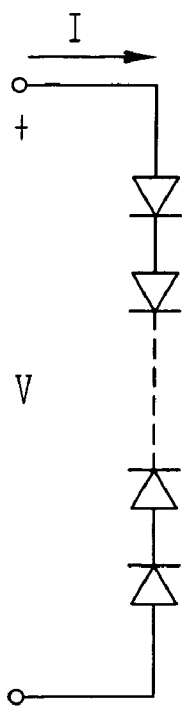
Figure 21:
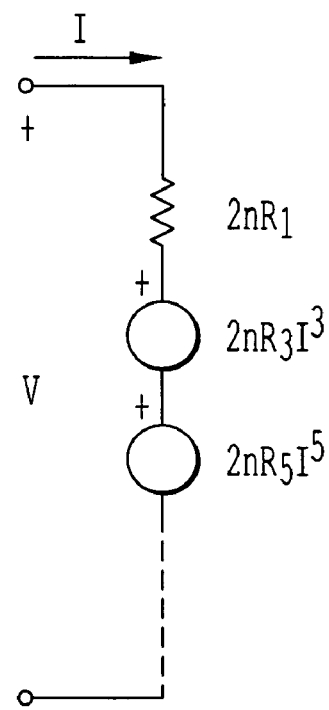
Figure 22:
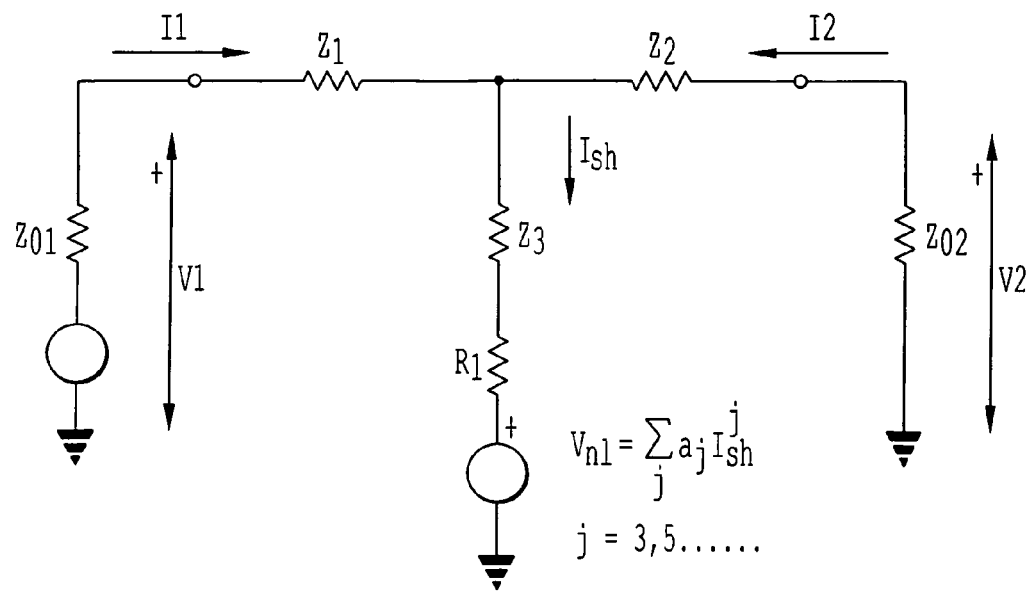
Figure 23:
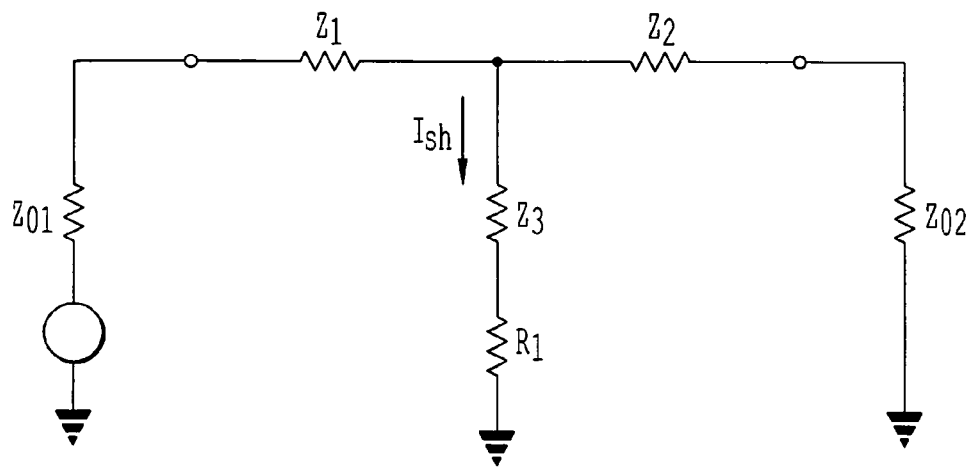

FIG. 17 schematically illustrates generation and application of a pre-distortion signal to a representative signal processing system 180. A pre-distortion module 181 provides a selected, pre-distorted input signal s(t;in;pre) that is received by a first signal processing module 183. In this example, the first module 183 is an electrical-to-optical transducer and produces an optical output signal. This first module output signal is received by a transmission module 185 and transported to a second signal processing module 187 (here, an optical-to-electrical transducer) that produces an electrical output signal. In the absence of provision of a pre-distortion signal by the pre-distortion module 181, the output signal s(t;out) from the signal processing module 187 would have a term linear in the signal current (proportional to I) plus one or more higher order terms (proportional to $I^m$ with m>1). By appropriate choice of coefficient(s) for one or more nonlinear terms generated by the pre-distortion module 181, the lowest order nonlinear terms (e.g., $I^m$ with m=2 and/or m=3) in the compensated output signal s(t;out) can be reduced in magnitude or made to vanish. For example, the pre-distortion circuit in FIG. 9 can provide a pre-distortion signal proportional to $I^2$ and a pre-distortion signal proportional to $I^3$ so that both of these lowest order nonlinearities can be removed from the output signal.

Appendix A

One-Port Non-Linearity's

Let the excitation signal (voltage V or current I) to a one-port non-linearity be a single complex phasor or a summation of a finite number of complex phasors.

The transfer characteristics of the one-port circuit is expressed as $$I = G(V) = G_1 V + G_2 V^2 + G_3 V^3 + \ldots \quad \text{(A-1)}$$

The converse relationship is $$V = R(I) = R_1 I + R_2 I^2 + R_3 I^3 + \ldots \quad \text{(A-2)}$$

The coefficients $G_i$ and $R_i$, are in general, complex.

EXAMPLES OF ONE-PORT NON-LINEARITY'S

A single diode with a bias current $I_0$ is considered. The diode equation is given by $$i = I_{sat}\left(e^{\frac{v}{V_T}} - 1\right) \quad \text{(A-3)}$$

where i and v are total, instantaneous values, or $$e^{\frac{v}{V_T}} \approx \frac{i}{I_{sat}} \quad (\text{for } i \gg I_{sat}) \quad \text{(A-4)}$$

under normal operating conditions. Equation (A-4) leads to $$\Rightarrow \frac{dv}{di} = \frac{V_T}{i} \quad \text{(A-5a)}$$

$$\frac{d^2 v}{d i^2} = -\frac{V_T}{i^2} \quad \text{(A-5b)}$$

$$\frac{d^3 v}{d i^3} = -\frac{2V_T}{i^3} \quad \text{(A-5c)}$$

and so on.

Now, $$v(I_0 + \Delta i) = v(I_0) + \left(\frac{dv}{di}\right)_{I_0} \Delta i + \left(\frac{d^2 v}{d i^2}\right)_{I_0} \frac{(\Delta i)^2}{2!} + \ldots \quad \text{(A-6)}$$

$$\Delta v = v(I_0 + \Delta i) - v(I_0) = \frac{V_T}{I_0}\Delta i - \frac{V_T}{I_0^2}\frac{(\Delta i)^2}{2} + \frac{V_T}{I_0^3}\frac{(\Delta i)^3}{3} + \ldots \quad \text{(A-7)}$$

using Eqs. (A-5) and (A-6). From Eqs. (A-2) and (A-7) we obtain $$R_1 = \frac{V_T}{I_0}, \quad \text{(A-8a)}$$

$$R_2 = \frac{V_T}{2I_0^2}, \quad \text{(A-8b)}$$

$$R_3 = \frac{V_T}{3I_0^3}, \quad \text{(A-8c)}$$

and so on.

The next example of a one-port non-linearity consists of an even number of identical diodes arranged in an anti-series configuration. If n is the number of diode pairs, we have, $$V/2n = R_1 I + R_2 I^2 + R_3 I^3 + \quad \text{(A-9a)}$$

$$-V/2n = R_1(-I) + R_2(-I)^2 + R_3(-I)^3 + \quad \text{(A-9b)}$$

From Eqs. (A-9a) and (A-9b), we obtain $$V = 2n(R_1 I + R_3 I^3 + \ldots). \quad \text{(A-10)}$$

Therefore, this type of one-port circuit generates only odd-order non-linear components.

Appendix B

Approximate Analysis of FIG. 5(a) and Similar Circuits

For weakly non-liner circuits, the effect of non-linear voltage source can be treated separately and principle of superposition applied to obtain the combined effect of linear and non-linear parts.

Referring to the circuit of FIG. 5a, and similar circuits, the non-linear current delivered by $V_{n1}$ is $$I_{nl} = \frac{V_{nl}}{R_1 + Z_3 + (Z_1 + Z_{01})par(Z_2 + Z_{02})}, \quad \text{(B-1)}$$

where the operator 'par' is defined as $$X_1 par X_2 = \frac{X_1 X_2}{X_1 + X_2}. \quad \text{(B-2)}$$

And, non-linear current through the impedance $Z_{o2}$ is given by $$I_{nl_2} = I_{nl} \frac{((Z_1 + Z_{01})par(Z_2 + Z_{02}))}{Z_2 + Z_{02}}. \quad \text{(B-3)}$$

Therefore, the non-linear voltage drop across the impedance $Z_{o2}$ is given by $$V_{nl} = I_{nl} \cdot Z_{02} \quad \text{(B-4)}$$
$$= \frac{V_{nl}}{R_1 + Z_3 + (Z_1 + Z_{01})par(Z_2 + Z_{02})} \cdot \frac{(Z_2 + Z_{01})par(Z_3 + Z_{02})}{Z_2 + Z_{02}} \cdot Z_{02}$$

using Eqs. (B-1) and (B-3).

If we assume $Z_1 = Z_2$, $Z_{01} = Z_{02} = Z_0$ and that the non-linearity is of third order, $V_{n1} = a_3 \cdot I_{sh}^3$, Eq. (B-4) is simplified to:

$$V_{nl_2} = \frac{1}{2} \frac{Z_0}{R_1 + Z_3 + \frac{1}{2}(Z_1 + Z_0)} \cdot a_3 \cdot I_{sh}^3 \quad \text{(B-5)}$$

$$= \frac{1}{2} \cdot \frac{Z_0}{R_1 + Z_3 + \frac{1}{2}(Z_1 + Z_0)} \cdot a_3 \cdot \left(\frac{1 + \frac{Z_1}{Z_0}}{Z_3 + R_1}\right) \cdot V_2^3$$

because $$V_2 = I_{sh} \frac{Z_3 + R_1}{Z_1 + Z_0} \cdot Z_0 \quad \text{(B-6)}$$

using the linear equivalent circuit.
Therefore, $$\frac{V_{nl_2}}{V_2} = F \cdot a_3 \cdot V_2^2 \quad \text{(B-7)}$$

$$F = \frac{1}{2} \cdot \frac{Z_0}{R_1 + Z_3 + \frac{1}{2} \cdot (Z_1 + Z_0)} \cdot \left(\frac{1 + \frac{Z_1}{Z_0}}{Z_3 + R_1}\right) \quad \text{(B-8)}$$

If the input excitation consists of two tones, we can express the two-tone intermodulation product $IM_3$ as $$IM_3 = 20 \cdot \log\left(\frac{3}{2} \cdot F \cdot a_3 \cdot V_2^2\right) \quad \text{(B-9)}$$

Using Eq. (B-7) and $$a_3 = \frac{2nV_T}{3I_0^3}, \quad \text{(B-10)}$$

-continued $$P_{out} = \frac{V_2^2}{Z_0}, \quad \text{(B-11)}$$

we have $$IM_3 = 20 \cdot \log\left(F \cdot \frac{nV_T}{I_0^3} \cdot P_{out} \cdot Z_0\right) \quad \text{(B-11)}$$

where $P_{out}$ is output power (fundamental) in Watts. A third-order Intercept Point is expressed in dBW as $$IP_3 = 10 \cdot \log\left(\frac{I_0^3}{F \cdot n \cdot V_T \cdot Z_0}\right) \quad \text{(B-12)}$$

For clipping-free operation, we require that $$I_0 \geq I_{sh} \cdot \zeta, \quad \text{(B-13)}$$

where I0=bias current and $\zeta$ is a form factor of the excitation signal, i.e. peak current/rms current. Using Eq. (B-6), Eq. (B-13) is expressible as $$I_0 \geq \sqrt{\frac{P_{out}}{Z_0}} \cdot \frac{Z_1 + Z_0}{Z_3 + R_1} \cdot \zeta \quad \text{(B-14)}$$

Also, using Eqs. (B-8), (B-13) and (B-14), the IP3 in Eq. (B-12) can be expressed as $$IP_3 \geq 10 \cdot \log\left(2 \cdot \frac{P_{out}^{\frac{3}{2}}}{Z_0^{\frac{1}{2}}} \cdot \zeta^3 \cdot \frac{1}{nV_T} \cdot \left(R_1 + Z_3 + \frac{1}{2} \cdot (Z_1 + Z_0)\right)\right) \quad \text{(B-15)}$$

If N is the linear loss of the circuit, expressed in nepers, we have $$Z_1 = Z_0 \frac{\sqrt{N} - 1}{\sqrt{N} + 1} \quad \text{(B-16a)}$$

$$R_1 + Z_3 = 2Z_0 \frac{\sqrt{N}}{N - 1} \quad \text{(B-16b)}$$

Using Eqs. (B-16a) and (B-16b) we get, $$R_1 + Z_3 + \frac{1}{2} \cdot (Z_1 + Z_0) = Z_0 \cdot \left[ \frac{N + 2\sqrt{N} - 1}{N - 1} \right]. \quad \text{(B-17)}$$

Therefore, from Eqs. (B-15) and (B-17)), we have $$IP_3 \geq 10 \cdot \log\left[ \frac{2\zeta^3 \sqrt{P_{out}^3 Z_0}}{nV_T} \cdot \frac{N + 2\sqrt{N} - 1}{N - 1} \right]. \quad \text{(B-18)}$$

What is claimed is:

1. A circuit for compensating for nonlinear distortion in an electronic signal, the circuit comprising:
    a signal input terminal and a signal output terminal, connected by selected first and second impedances, arranged in series and having a common impedance terminal;
    a sub-circuit including at least first and second diodes, connected in an anti-series configuration, where a first terminal of the first diode is connected to a selected third impedance that is connected to the common terminal, and a first terminal of the second diode is grounded; and
    a sub-circuit including third and fourth diodes, connected in said anti-series configuration, where a first terminal of the third diode is connected to a selected fourth impedance that is connected to said common terminal, and a first terminal of the fourth diode is grounded.

2. The circuit of claim 1, further comprising a third diode, having a first terminal connected to a selected fourth impedance that is connected to said common terminal, and having a second terminal that is grounded.

3. The circuit of claim 2, wherein each of said first diode, said second diode and said third diode has a bias current value that is selected so that said first, second and third diodes together provide a voltage response that includes a first signal component that is second order in an electrical current variable in said circuit and includes a second signal component that is third order in the electrical current variable in said circuit, and the first and second signal components have selected signal coefficients.

4. The circuit of claim 1, wherein each of said first diode and said second diode has a bias current value that is selected so that said first and second diodes together provide a voltage response that includes a signal component that is third order in an electrical current variable in said circuit and the third order component has a selected signal coefficient.

5. A circuit for compensating for nonlinear distortion in an electronic signal, the circuit comprising:
    a signal input terminal and a signal output terminal, connected by selected first and second impedances, arranged in series and having a common impedance terminal; and
    a sub-circuit including at least first and second diodes, connected in an anti-parallel configuration, where an anode of the first diode and a cathode of the second diode are connected to a selected third impedance that is connected to the common terminal, and a cathode of the first diode and an anode of the second diode are grounded; and
    a sub-circuit including third and fourth diodes, connected in said anti-series configuration, where a first terminal of the third diode is connected to a selected fourth impedance that is connected to said common terminal, and a first terminal of the fourth diode is grounded.

6. The circuit of claim 5, further comprising third and fourth diodes, connected in said anti-parallel configuration, where an anode of the third diode and a cathode of the fourth diode are connected to a selected fourth impedance that is connected to said common terminal, and a cathode of the third diode and an anode of the fourth diode are grounded.

7. The circuit of claim 5, further comprising a third diode with a first terminal connected to a selected fourth impedance that is connected to said common terminal, and with a second terminal connected to ground.

8. The circuit of claim 7, wherein each of said first diode, said second diode and said third diode has a bias current value, and the bias current values are selected so that said first, second and third diodes together provide a voltage response that includes a signal component that is second order in an electrical current variable in said circuit and the second order component has a selected signal coefficient.

9. The circuit of claim 5, wherein each of said first diode and said second diode has a bias current value that is selected so that said first and second diodes together provide a voltage response that includes a signal component that is third order in an electrical current variable in said circuit and the third order component has a selected signal coefficient.

10. A circuit for compensating for nonlinear distortion in an electronic signal, the circuit comprising:
    a signal input terminal and a signal output terminal, connected by selected first and second impedances, arranged in series and having a common impedance terminal;
    a sub-circuit including at least first and second diodes, connected in an anti-series configuration, and third and fourth diodes, connected in an anti-series configuration, where a first terminal of the first diode is connected to a selected third impedance that is connected to the common terminal, a first terminal of the second diode is connected to a first terminal of the third diode, and a first terminal of the fourth diode is grounded; and
    a sub-circuit including third and fourth diodes, connected in said anti-series configuration, where a first terminal of the third diode is connected to a selected fourth impedance that is connected to said common terminal, and a first terminal of the fourth diode is grounded.

11. The circuit of claim 10, further comprising a fifth diode, having a first terminal connected to a selected fourth impedance that is connected to said common terminal, and having a second terminal that is grounded.

12. The circuit of claim 10, wherein each of said first diode, said second diode, said third diode and said fourth diode has a bias current value that is selected so that said first, second third and fourth diodes together provide a voltage response that includes a signal component that is third order in an electrical current variable in said circuit and the third order component has a selected signal coefficient.

13. A method for compensating for nonlinear distortion in an electronic signal, the method comprising:
   determining at least one nonlinear term in a current signal I, represented as $c_k \cdot I^k$, where k is an integer at least equal to 2, that is present in a circuit voltage when the current signal I is processed by a selected signal processing circuit;
   processing the current signal I through a selected compensation circuit to generate at least one nonlinear term, $a_p \cdot I^p$, in the current, where p is a selected integer equal to k, where the compensation circuit comprises:
      a signal input terminal and a signal output terminal, connected by selected first and second impedances, arranged in series and having a common impedance terminal;
      a sub-circuit including at least first and second diodes, connected in an anti-series configuration, where a first terminal of the first diode is connected to a selected third impedance that is connected to the common terminal, and a first terminal of the second diode is grounded; and
      a sub-circuit including third and fourth diodes, connected in said anti-series configuration, where a first terminal of the third diode is connected to a selected fourth impedance that is connected to said common terminal, and a first terminal of the fourth diode is grounded,
   where at least one parameter value for the first and second diodes is chosen so that the at least one nonlinear term generated by the compensation circuit, when added to the current signal I and processed through the processing circuit, cancels the nonlinear term, $c_k \cdot I^k$, in the circuit voltage that would otherwise result from processing the current signal I.

14. The method of claim 13, further comprising providing a third diode, having first terminal connected to a selected fourth impedance that is connected to said common terminal, and having a second terminal that is grounded.

15. A method for compensating for nonlinear distortion in an electronic signal, the method comprising:
   determining at least one nonlinear term in a current signal 1, represented as $c_k \cdot I^k$, where k is an integer at least equal to 2, that is present in a circuit voltage when the current signal I is processed by a selected signal processing circuit;
   processing the current signal I through a selected compensation circuit to generate at least one nonlinear term, $a_p \cdot I^p$ here p is a selected integer equal to k, in the current, where the compensation circuit comprises:
      a signal input terminal and a signal output terminal, connected by
      selected first and second impedances, arranged in series and having a common impedance terminal;
      a sub-circuit including at least first and second diodes, connected in an anti-parallel configuration, where an anode of the first diode is connected to a selected third impedance that is connected to the common terminal, and a cathode of the second diode is grounded; and
      a sub-circuit including third and fourth diodes, connected in said anti-series configuration, where a first terminal of the third diode is connected to a selected fourth impedance that is connected to said common terminal, and a first terminal of the fourth diode is grounded,
   where at least one parameter value for the first and second diodes is chosen so that the at least one nonlinear term generated by the compensation circuit, when added to the current signal I and processed through the processing circuit, cancels the nonlinear term, $c_k \cdot I^k$, in the circuit voltage that would otherwise result from processing the current signal I.

16. The method of claim 15, further comprising providing third and fourth diodes, connected in said anti-parallel configuration, where an anode of the third diode is connected to a selected fourth impedance that is connected to said common terminal, and a cathode of the fourth diode is grounded.

17. The method of claim 15, further comprising a third diode with a first terminal connected to a selected fourth impedance that is connected to said common terminal, and with a second terminal connected to ground.

* * * * *